(12) United States Patent
Gierak et al.

(10) Patent No.: US 8,664,621 B2
(45) Date of Patent: Mar. 4, 2014

(54) DEVICE FOR GENERATING AN ION BEAM WITH MAGNETIC FILTER

(75) Inventors: Jacques Gierak, Le Plessis Pate (FR); Ralf Jede, Allemagne (DE)

(73) Assignee: Centre National de la Recherche Scientifique (C.N.R.S.), Paris (FR)

( * ) Notice: Subject to any disclaimer, the term of this patent is extended or adjusted under 35 U.S.C. 154(b) by 191 days.

(21) Appl. No.: 13/063,742

(22) PCT Filed: Sep. 14, 2009

(86) PCT No.: PCT/FR2009/051720
§ 371 (c)(1),
(2), (4) Date: Oct. 3, 2011

(87) PCT Pub. No.: WO2010/029270
PCT Pub. Date: Mar. 18, 2010

(65) Prior Publication Data
US 2012/0018648 A1    Jan. 26, 2012

(30) Foreign Application Priority Data

Sep. 15, 2008 (FR) ...................................... 08 56189
Sep. 15, 2008 (FR) ...................................... 08 56190

(51) Int. Cl.
*H01J 27/00* (2006.01)

(52) U.S. Cl.
USPC ..................................... 250/423 R; 250/424

(58) Field of Classification Search
USPC ............... 250/423 R, 424, 425, 423 P, 423 F; 315/111.01, 111.11, 111.81
See application file for complete search history.

(56) References Cited

U.S. PATENT DOCUMENTS

| 4,272,699 A | 6/1981 | Faubel et al. |
| 6,294,862 B1 | 9/2001 | Brailove et al. |
| 2009/0121148 A1* | 5/2009 | Pohl et al. ................. 250/396 R |
| 2010/0176296 A1* | 7/2010 | Kaito et al. .................... 250/307 |

FOREIGN PATENT DOCUMENTS

| DE | 3404802 | 8/1984 |
| JP | 60133635 | 7/1985 |
| WO | WO 02/078036 | 10/2002 |

OTHER PUBLICATIONS

R I Hornsey and P Marriott, The Effects of Source Temperature and Characteristics on the Optical Emission From a Gallium Liquid Metal Ion Source, J. Phys. D: Appl. Phys 22 (1989) pp. 699-704.
Ka-Ngo Leung, The Application and Status of the Radio Frequency Driven Multi-Cusp Ion Source (Invited), Review of Scientific Instruments, vol. 71, No. 2, Feb. 2000, pp. 1064-1068.
PCT Search and Written Opinion for No. PCT/FR2009/051720 dated Jan. 15, 2010.

* cited by examiner

*Primary Examiner* — Phillip A Johnston
*Assistant Examiner* — Hanway Chang
(74) *Attorney, Agent, or Firm* — Patterson & Sheridan, LLP

(57) ABSTRACT

This device (2) for generating an ion beam (4) including a liquid metal ion source (18) is characterized in that the ion source is surrounded by a cryogenic trap (28) maintained at a low temperature, this cryogenic trap being able to trap volatile chemical species (G) by condensing them before they can reach the ion source.

18 Claims, 4 Drawing Sheets

DEVICE FOR GENERATING AN ION BEAM WITH MAGNETIC FILTER

The present invention relates to a device for generating an ion beam including a liquid metal ion source. Such a device for generating an ion beam is known from document WO 02/078036 A2. This known device includes an ion source located upstream of an extraction and acceleration system of the ion beam and a work chamber.

It has been observed that the use of the device described in document WO 02/078036 A2 combined with the techniques for injecting reactive gases or precursors at the work chamber noticeably reduces the lifetime of the liquid metal ion source as well as the stability of the process emitting the metal ions by reaction of the residual traces of injected gas with the metal film of the ion source kept in the liquid phase. This is particularly sensitive when this reaction occurs near the end portion of the source made up of a needle and generally manifests itself through interruptions in the transmission of the ion beam and lateral movement of the emissive site.

Indeed, even a very small proportion of the gas molecules injected into the work chamber that scatter near the ion source has a very high likelihood of being ionized, then being lifted by the area having a very strong electrostatic field reigning at the apex of the needle ($\sim 10^{10}$ V/m). The deposition of these molecules will locally modify the physico-chemical properties of the liquid metal film or the support needle and therefore disrupt the transmission properties initially chosen.

This molecule deposition can constitute a source of pollution/contamination for:
(i) The liquid metal film through formation of a refractory oxide barrier interrupting the contributing effect of the liquid metal based on a surface scattering mechanism;
(ii) The geometry of the support needle by growth of lateral parasitic structures capable of activating an emissive site to the detriment of the original site.

One aim of the invention is therefore to make a device for generating an ion beam including a liquid metal ion source compatible with the techniques for injecting gas into the work chamber.

This aim is achieved by a device for generating an ion beam of the aforementioned type, characterized in that the ion source is surrounded by a cryogenic trap maintained at a low temperature, this cryogenic trap being able to trap volatile chemical species by condensing them before they can reach the ion source.

By surrounding the ion source with a cryogenic trap, it is effectively protected from the effect of the gases injected into the work chamber at the sample. The gases are thus neutralized by the cryogenic trap and no longer act on the ion source.

Document JP 60 133 635 describes a cryogenic ion source using hydrogen gas as "fuel," i.e. as contributing species to ionize. The source comprises a needle integrated into a confinement enclosure that serves to create a local overpressure of the hydrogen gas injected into the enclosure. The hydrogen gas is introduced into the confinement enclosure via a supply line connected to an opening formed in one of the walls of the enclosure. Baffles are placed inside the line and serve to condense, and thus trap, traces of unwanted gases present in the hydrogen stream to be ionized. The operation of this source necessarily requires that the assembly formed by the needle and the enclosure simultaneously be maintained at a very low temperature in order to guarantee the condensation of the hydrogen gas on the needle. The cold walls of the confinement enclosure must be as close as possible to the needle.

Document U.S. Pat. No. 4,272,699 describes an electron impact ion source that is part of a mass spectrometer. A gas stream whereof the composition needs to be analyzed is introduced on one side in a chamber so it can be ionized there by electron bombardment, and the ionized stream leaves the chamber on the other side towards a mass analyzer. The ionization chamber is inserted into a cryogenic chamber serving to reduce the spectrum of residual gases by trapping on its inner walls. The aim is to improve the signal to noise ratio by condensing, and thereby eliminating, residual vapors in favor of the stream of injected gas one wishes to analyze.

According to specific embodiments, the device for generating an ion beam according to the invention comprises one or several of the following features, considered alone or according to all technically possible combinations:

The cryogenic trap is maintained at a low temperature by:
circulation or accumulation of a cryogenic fluid, the cryogenic fluid preferably being liquid nitrogen; or
a mechanical refrigerator generating a low vibration emission; or
an electric refrigerator;

The cryogenic trap is maintained at a temperature below 100 K;

The cryogenic trap comprises a sheath with two open ends surrounding the ion source;

The cryogenic trap comprises a spiraled cryogenic fluid tube wound around the sheath;

One of the open ends of the sheath is used for the passage of the ion beam produced by the ion source;

The sheath is formed by a rotating wall, said wall comprising a first cylindrical section and a second tapered section;

An extraction electrode, the cryogenic trap surrounding both the ion source and the extraction electrode;

The extraction electrode being provided with an opening allowing the passage of the ion beam, the device also comprises a means for generating a magnetic field able to generate a magnetic field at the opening of the extraction electrode, the generated magnetic field being able to deviate charged particles attracted by the ion source so that these charged particles do not reach the ion source;

The generated magnetic field is able to deviate the charged particles so that they encounter a wall of the extraction electrode instead of reaching, by passing through the opening of the extraction electrode, the ion source;

The means for generating a magnetic field is arranged at the opening of the extraction electrode;

The opening for the extraction electrode is made in a recess of the extraction electrode, the means for generating a magnetic field being placed inside that recess, on the edge of said opening;

The means for generating a magnetic field comprises at least one permanent magnet;

The means for generating a magnetic field is made up of two permanent magnets placed opposite each other;

The two permanent magnets define an air gap between them, which is preferably adjustable from about 2 to about 4 mm;

The magnetic field induced by the two permanent magnets in the air gap is in the vicinity of 0.1 to 1 Tesla;

The liquid metal ion source comprises a conductive rod ending with a needle, a container fixed to the rod and serving to receive a metal charge to be liquefied, as well as a conductive filament comprising coils passed through by the needle of the rod.

The invention also concerns a focused ion beam installation comprising:

a work chamber containing a sample holder and a reactive gas inlet near the sample holder; and a column with several levels, including a first level for generating the ion beam and a second level for orienting and focusing the ion beam, in which installation the first level includes a device for generating an ion beam as stated above.

The invention will be better understood upon reading the following description, provided solely as an example, and done in reference to the appended drawings.

Figure 1:
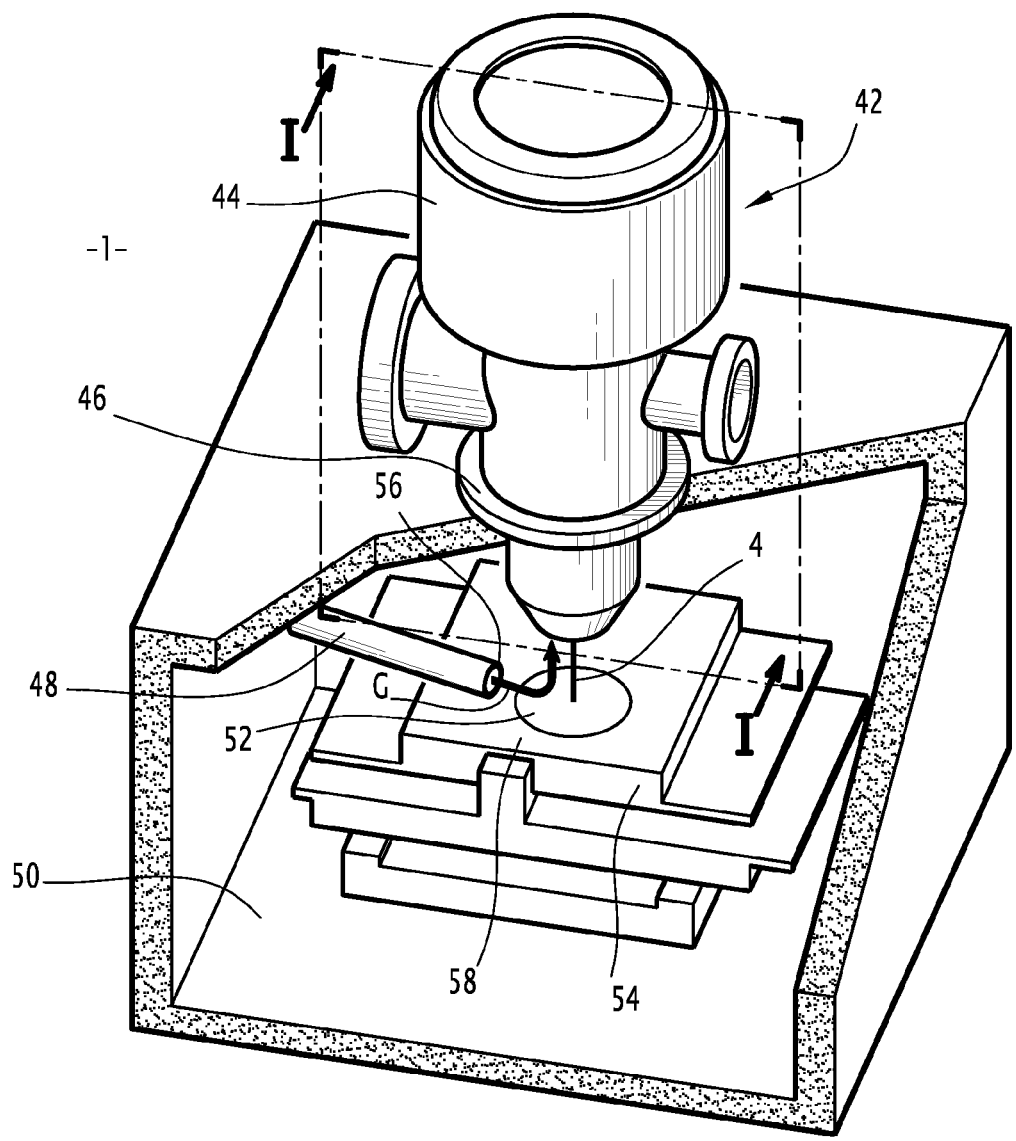
FIG. 1 is a cut-away perspective view of a focused ion beam installation according to one embodiment of the invention.

FIG. 1 shows a focused ion beam installation 1 according to the invention. This installation 1 includes a parallelepiped work chamber 50 maintained under vacuum as well as a generally cylindrical column 42. The column 42 passes through one of the walls of the work chamber 50 and extends with one of its ends inside the latter.

The column 42 has several levels, and in particular a first level 44 containing a device 2 for generating an ion beam (cf. FIG. 3), and a second level 46 containing means for orienting and focusing the ion beam generated inside the first level.

The work chamber 50 contains a holder 54 used to hold and position a sample 52 with nanometric precision in three dimensions. To that end, the holder 54 preferably comprises a laser interferometer.

Moreover, the work chamber 50 contains a gas inlet 48, the opening 56 of which is located close to the work area 58 of the holder 54 able to receive a sample 52.

Figure 2:
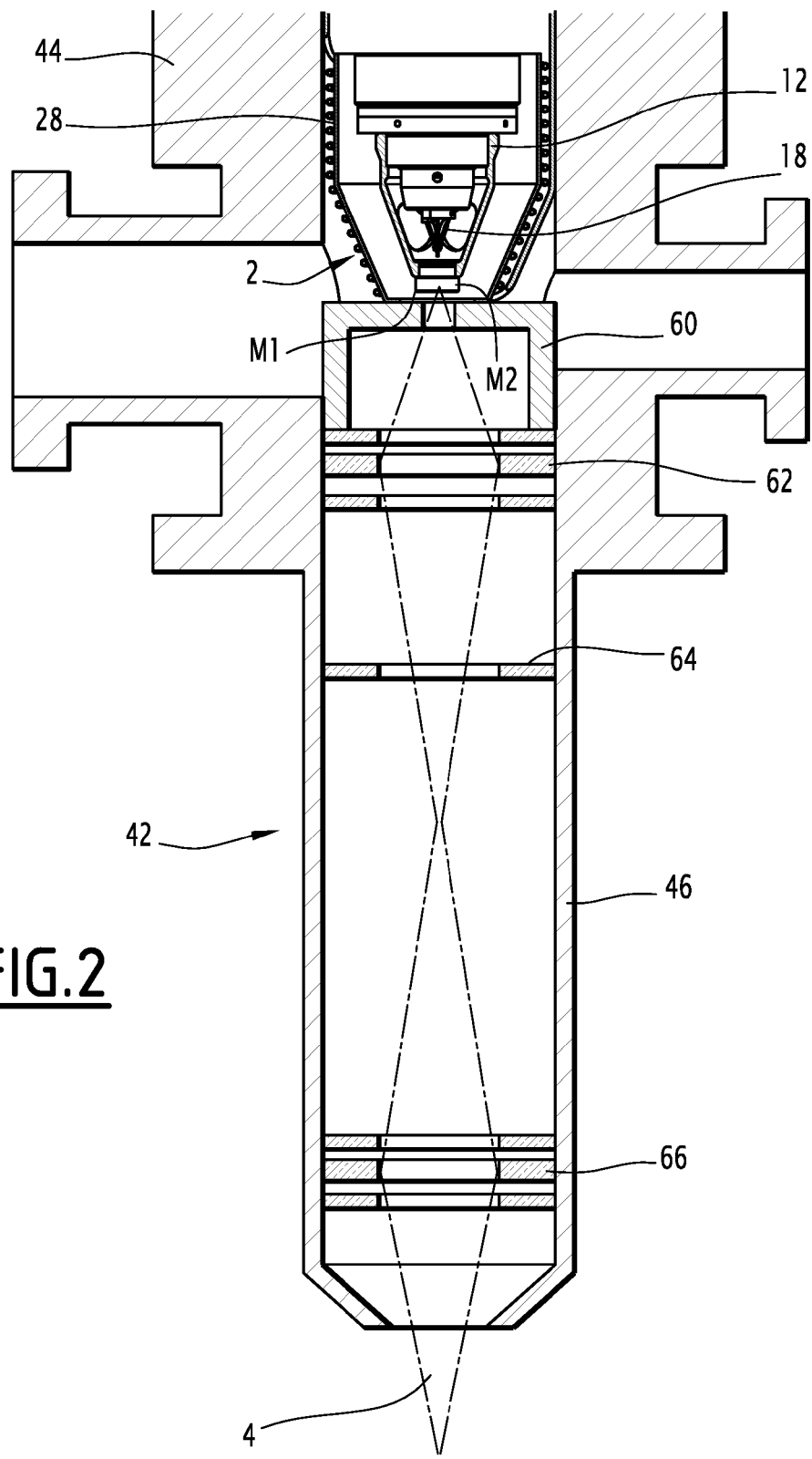
FIG. 2 is a longitudinal cross-sectional view of the column of the installation of FIG. 1, along arrows I-I.

FIG. 2 provides a diagrammatic overview of the main elements present inside the column 42. It shows, from top to bottom, the ion source 18, the extraction electrode 12, the accelerator 60, a first lens 62, a diaphragm 64, and a second lens 66.

Figure 3:
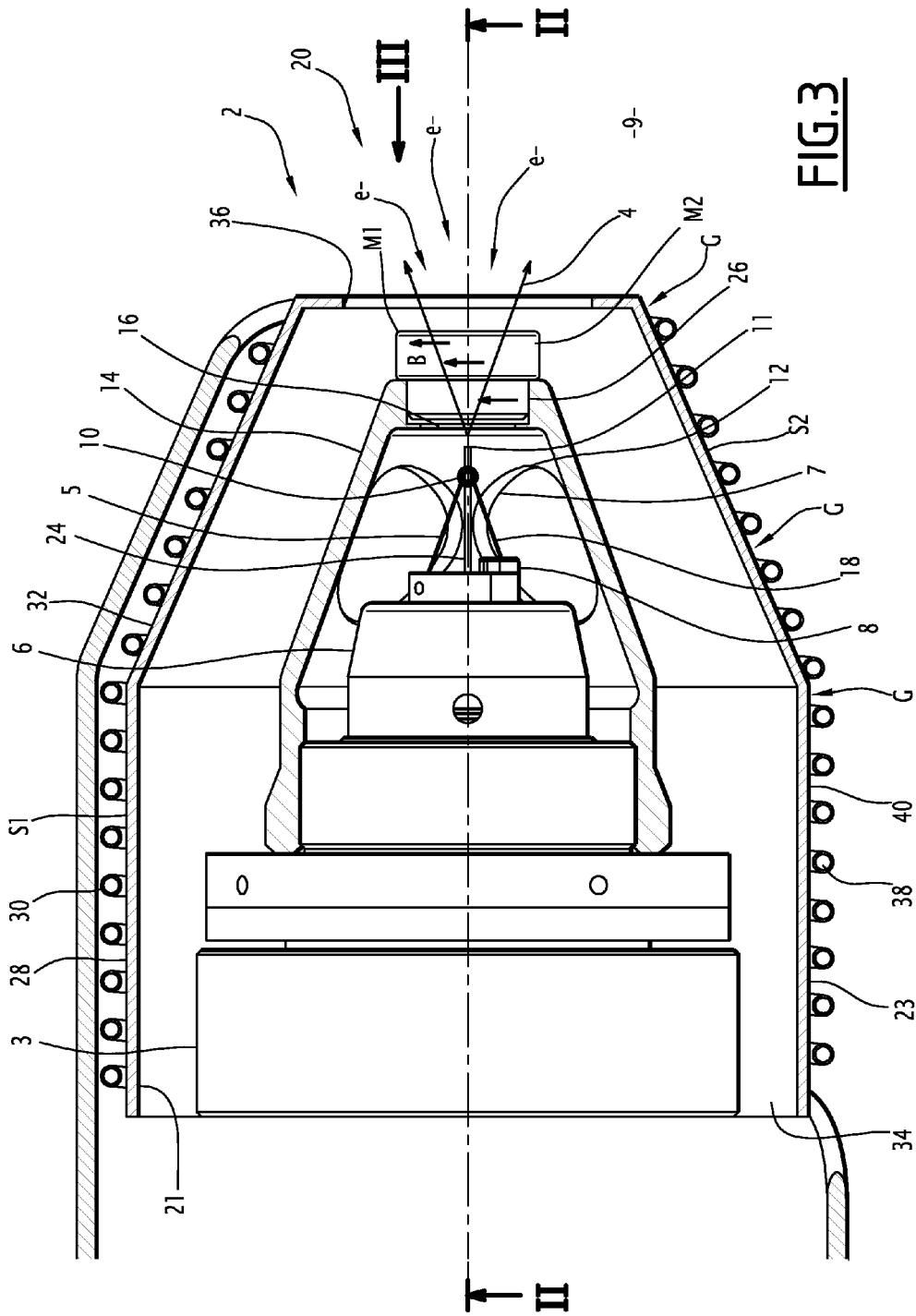
FIG. 3 is a side view, partially in cross-section, of the device for generating an ion beam integrated into the installation according to FIG. 1.

FIG. 3 illustrates a device for generating an ion beam, this device being designated by reference 2. This device 2 is located inside a space 9 of the first level 44, the space being maintained under vacuum. The device 2 comprises an ion source 18 surrounded by an extraction electrode 12. The ion source 18 as well as the extraction electrode 12 are fixed on a holder 6. A base 3 is also shown on which the holder 6 is mounted.

The source 18 comprises a conductive rod 24 ending with a needle 11, a container R (cf. FIG. 4) fixed to the rod 24 and serving to receive a contributed metal charge to be liquefied, and a conductive filament 5 including coils. These coils are passed through by the needle 11 of the rod 24. The rod 24 and the container R are made from a conductive and refractory material, such as graphite or tungsten. The contributing metal is a high-purity material incorporated into the ion source 18 before use.

"Lower end" will refer to the end 8 of the ion source 18 located near the holder 6. The end 10 of the ion source 18 opposite the lower end 8 will be called "upper end." This upper end 10 comprises the needle 11 of the rod 24.

The extraction electrode 12 is provided with an opening 16, called "extraction diaphragm," and orifices such as the orifice 7, through which residual gases can be pumped. The opening 16 and said orifices are made in a wall 14 of the extraction electrode 12. The opening 16 is located in the middle of a cylindrical recess 26 of the extraction electrode 12.

The features of the device 2 just described are known and, for more detailed information, reference is made to documents WO 02/078036 A2 and WO 96/02065. We will now focus on the new elements that are the object of the present invention.

The device 2 has the particularity of comprising a cryogenic trap 28. The trap 28 must be far enough from the ion source 18 to prevent cooling of the contributing metal. This trap 28 comprises a sheath 32 surrounding the ion source 18, as well as the extraction electrode 12. The sheath 32 has a cylindrical section S1 and a tapered section S2. The revolving wall 40 of the sheath 32 forms a screen around the ion source 18. The inner surface 21 of the wall 40 is shown facing the ion source 18, and the outer surface 23 of the wall 40 is shown facing the space 9. In other words, the outer surface 23 is situated on one side of the wall 40, while the ion source 18 is situated on the other side of the wall 40.

The sheath 32 has two open ends 34 and 36. The open end 34 makes it possible to insert the ion source 18 and the extraction electrode 12 inside the sheath 32. The open end 36 allows the passage of the ion beam 4 generated by the ion source 18.

The cryogenic trap 28 also comprises a spiral tube 38 wound around the sheath 32. This tube 38 allows the circulation or accumulation of a cryogenic fluid 30, preferably liquid nitrogen.

A second novelty of the device 2 is the addition of a magnetic filter M1, M2. This magnetic filter comprises two permanent magnets M1 and M2 that are arranged opposite each other inside the recess 26 of the extraction electrode 12.

Figure 4:
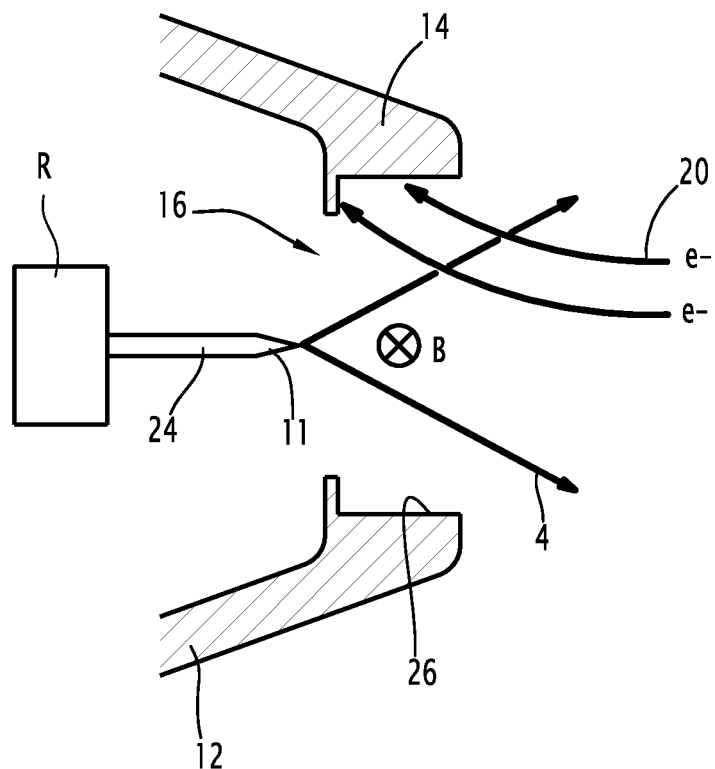
FIG. 4 is a cross-sectional view of a detail of FIG. 3, along arrows II-II.
Figure 5:
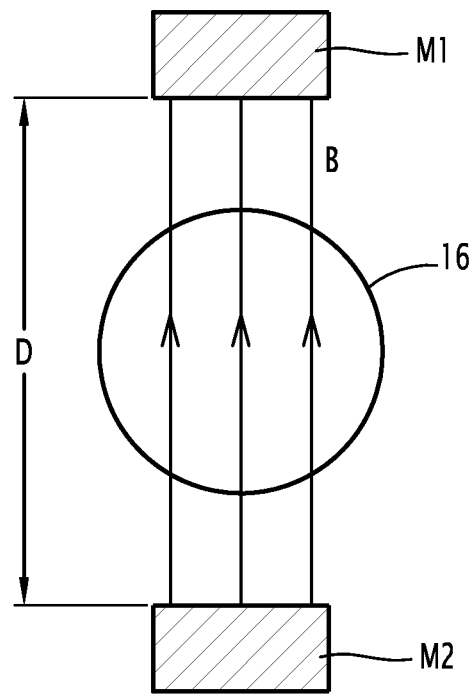
FIG. 5 is a frontal view of the emitting opening of the device of FIG. 3, along arrow III.

In reference to FIG. 5, these two magnets M1 and M2 define an air gap D between them. This air gap D is preferably adjustable between about 2 and 4 mm. The two magnets M1 and M2 cause, in the air gap D, a magnetic field B, the value of which is preferably in the vicinity of 0.1 to 1 Tesla. The magnetic field B is shown in FIGS. 3 to 5 by arrowed field lines.

FIG. 4 is a cross-sectional view of the needle of the extraction electrode 12, along line II-II of FIG. 3. FIG. 4 therefore shows a view perpendicular to the one shown in FIG. 3. FIG. 4 shows the magnetic field B, the field lines of which are perpendicular to the plane of the drawing. The needle 11 of the conductive rod 24 that emits the ion beam 4 is also visible. The magnets M1 and M2 are not visible in FIG. 4, since they are located behind and in front of the plane of the drawing, respectively.

The ion source 18 is a liquid metal ion source, commonly shortened to "LMIS." Such a LMIS can generate a metal ion beam, for example a gallium or aluminum ion beam. More precisely, a current is passed through the conductive filament 5 which, by Joule effect, heats the metal container R as well as the rod 24. The metal charge present in the container R is thus liquefied and spreads on the surface of the rod 24, and in particular on the needle 11. The extraction electrode 12 pulls metal ions out of the liquid metal layer covering the apex of the needle 11.

The pulled out metal ions are attracted by the extraction electrode 12 and pass through the opening 16. They leave the device 2, then the first level 44, in the form of a beam 4. The ion beam 4 reaches the second level 46 to be oriented and focused there on a sample 52 located inside the work chamber 50. The treatment of the surface of the sample 52 by the beam 4 is done by moving the holder 54. The ion beam 4 can be qualified as primary beam, and the products caused by the use of the beam 4 on the sample 52 as secondary sub-products.

The cryogenic trap 28 was added to the device 2 in order to make it compatible with the gas injection techniques frequently used in industrial applications of ion generating devices. These injection techniques consist of introducing reactive gases or precursors into the work chamber 50 using one or several gas inlets, such as the inlet 48, in order to diversify or improve and accelerate the treatment of the samples 52 by the ion beam 4.

A first of these techniques is deployed when the ion beam 4 is used to etch a sample. Reactive gases are conveyed by the inlet 48 and leaves it towards the sample 52. The gases react with the atoms of the sample 52 sprayed by the beam 4 while forming volatile compounds. The volatile compounds are discharged by the pumping system from the work chamber 50. This method improves the etching speed because it neutralizes and discharges the cuttings resulting from the etching.

The injection technique is also used to deposit substances on a sample. To that end, precursor gases are introduced through the inlet 48 into the work chamber 50 whereof the molecules are dissociated by the action of the ion beam 4. The non-volatile compounds of this reaction then form a solid deposition adhering to the surface of the sample 52.

In the context of a liquid metal ion source, these injection techniques have a major drawback. Indeed, the gases injected into the work chamber 50 scatter inside the latter and penetrate the column 42. Because of a favorable pressure gradient (the vacuum inside the first level 44 is higher than the vacuum within the work chamber 50), these gases travel to the source 18 and interact with the liquid metal. These interactions have extremely harmful effects on the ion source 18, and destabilize it. Thus, it becomes impossible to maintain the stability of the ion emission over periods of several hours.

The cryogenic trap 28 makes it possible to resolve this problem by protecting the ion source 18 of the injected gas vapors. The liquid contributing metal is thus preserved. Owing to its cryogenic trap, the device 2 for generating ion beams is compatible with the gas injection techniques.

The cryogenic trap 28 works as follows. Liquid nitrogen 30 is made to circulate inside the tube 38 so as to cool the wall 40 of the sheath 32 to a temperature below 100 K. The sheath 32 thus cooled constitutes a trap for the injected gas vapors G, which are shown in FIGS. 1 and 3 by wavy arrows. These volatile species G enter the column 42, pass through the second level 46, and reach the first level 44 to then spread in the space 9 around the device 2 for generating a beam of ions. The vapors G are stopped on their trajectory towards the ion source 18 by the outer surface 23 of the wall 40, which forms a dam. Once stopped by the outer surface 23, the species G cool quickly and therefore lose a substantial portion of their kinetic energy. The species G condense on the outer surfaces 23 and are actually "trapped." Due to lack of energy, they remain "stuck" to the cryogenic trap 28 and therefore can no longer reach the ion source 18.

According to one alternative of the invention, the cryogenic trap comprises, as cooling means, a cryogenerator/mechanical refrigerator or an electric refrigerator, preferably a "Peltier" effect device, instead of a cryogenic fluid.

The magnetic filter M1, M2 was added to the device 2 in order to prevent the secondary electrons 20 (cf. FIGS. 3 and 4) from reaching the ion source 18. These secondary electrons 20 are created by the impact of ions of the ion beam 4 on the walls of the environment of the device 2. They are attracted by the local high-intensity electrical field existing around the needle 11. In the absence of a magnetic field B, the secondary electrons 20 penetrate the inside of the extraction electrode 12 through the opening 16 and contaminate the ion source 18.

Owing to the magnetic field B at the opening 16, the secondary electrons 20 are deviated from their trajectory, as shown in FIG. 4, and are intercepted by the wall 14 of the extraction electrode 12, which itself generates an attractive electrostatic field. The secondary electrons 20 are thus neutralized. The magnetic filter M1, M2 therefore protects the liquid metal of the ion source 18 from the secondary electrons.

On the other hand, the influence of the magnetic field B on the trajectory of the metal ions coming from the needle 11 of the rod 24 through the opening 16 is negligible. Indeed, the metal ions have a much larger mass and kinetic energy than the secondary electrons. Thus, even in the presence of the magnetic field B, the trajectory of the metal ions remains essentially unchanged.

It should in particular be noted that the magnetic filter according to the invention can also assume forms other than the one just described. Indeed, to achieve the desired aim, any means will suffice, as long as it is able to generate a magnetic field suitable for preventing the secondary electrons from reaching the ion source 18.

The device for generating an ion beam according to the invention has the following advantages in particular:

a more stable operation of the ion source at a low emission current (<3 µA) owing to the elimination of the secondary electron current hitting the emitting point;

an increase in the lifetime of the source;

better purity of the ion beam emitted through increased protection of the source; and the obtainment of a more effective pumping effect in the region of the source ions making it possible to maintain the emitting source in a high vacuum (10−8 mbar) and thus "erase" the influence of the vacuum fluctuations related to loading and unloading of the samples, which can thus be multiplied as desired without damaging the ion source, which can be left operating.

In summary, this device makes it possible to preserve the integrity of the ion source and, as a result, to space out the number and the frequency (i) of the decontamination operations generally carried out by heating the source, which require interrupting use, involving setting the instrument again and causing a loss by evaporation of the liquid metal, and (ii) of replacements of the sources at the end of their lives.

The invention makes it possible to improve the productivity of the device, the user being able to conserve operational adjustments (optical centering of the ion source relative to the electrostatic optical system, focusing and correcting the residual astigmatism of the beam) during considerably longer periods of time.

The invention claimed is:

1. A device for generating an ion beam including a liquid metal ion source, wherein the ion source is surrounded by a cryogenic trap maintained at a low temperature, this cryogenic trap being able to trap volatile chemical species by condensing them before they can reach the ion source.

2. The device according to claim 1, wherein the cryogenic trap is maintained at a low temperature by:
   circulation or accumulation of a cryogenic fluid, the cryogenic fluid preferably being liquid nitrogen; or
   a mechanical refrigerator generating a low vibration emission; or
   an electric refrigerator.

3. The device according to claim 1, wherein the cryogenic trap is maintained at a temperature below 100 K.

4. The device according to claim 1, wherein the cryogenic trap comprises a sheath with two open ends surrounding the ion source.

5. The device according to claim 4, wherein the cryogenic trap comprises a spiraled cryogenic fluid tube wound around the sheath.

6. The device according to claim 4, wherein one of the open ends of the sheath is used for the passage of the ion beam produced by the ion source.

7. The device according to claim 4, wherein the sheath is formed by a rotating wall, said wall comprising a first cylindrical section and a second tapered section.

8. The device according to claim 1, wherein the device also including an extraction electrode, the cryogenic trap surrounding both the ion source and the extraction electrode.

9. The device according to claim 8, where, the extraction electrode being provided with an opening allowing the passage of the ion beam, the device also comprises a means for generating a magnetic field able to generate a magnetic field at the opening of the extraction electrode, the generated magnetic field being able to deviate charged particles attracted by the ion source so that these charged particles do not reach the ion source.

10. The device according to claim 9, wherein the means for generating a magnetic field is arranged at the opening of the extraction electrode.

11. The device according to claim 10, wherein the opening for the extraction electrode is made in a recess of the extraction electrode, the means for generating a magnetic field being placed inside that recess, on the edge of said opening.

12. The device according to claim 9, wherein the means for generating a magnetic field comprises at least one permanent magnet.

13. The device according to claim 12, wherein the means for generating a magnetic field is made up of two permanent magnets placed opposite each other.

14. The device according to claim 13, wherein the two permanent magnets define an air gap between them, which is preferably adjustable from about 2 to about 4 mm.

15. The device according to claim 14, wherein the magnetic field induced by the two permanent magnets in the air gap is in the vicinity of 0.1 to 1 Tesla.

16. The device according to claim 8, wherein the generated magnetic field is able to deviate the charged particles so that they encounter a wall of the extraction electrode instead of reaching, by passing through the opening of the extraction electrode, the ion source.

17. The device according to claim 1, wherein the liquid metal ion source comprises a conductive rod ending with a needle, a container fixed to the rod and serving to receive a metal charge to be liquefied, as well as a conductive filament comprising coils passed through by the needle of the rod.

18. A focused ion beam installation comprising:
a work chamber containing a sample holder and a reactive gas inlet near the sample holder; and
a column with several levels, including a first level for generating the ion beam and a second level for orienting and focusing the ion beam,
in which installation the first level includes a device for generating an ion beam according to claim 1.

* * * * *